(12) United States Patent
Gosmain et al.

(10) Patent No.: US 7,180,331 B2
(45) Date of Patent: Feb. 20, 2007

(54) VOLTAGE TOLERANT STRUCTURE FOR I/O CELLS

(75) Inventors: Vincent Gosmain, Aix-en-Provence (FR); David Bernard, Aix-en-Provence (FR)

(73) Assignee: Atmel Corporation, San Jose, CA (US)

( * ) Notice: Subject to any disclaimer, the term of this patent is extended or adjusted under 35 U.S.C. 154(b) by 115 days.

(21) Appl. No.: 11/028,934

(22) Filed: Jan. 3, 2005

(65) Prior Publication Data

US 2006/0066355 A1    Mar. 30, 2006

(30) Foreign Application Priority Data

Sep. 28, 2004    (FR) .................................. 04 10264

(51) Int. Cl.
*H03K 19/0175* (2006.01)
(52) U.S. Cl. ......................................... 326/83; 326/86
(58) Field of Classification Search ............. 326/80–90
See application file for complete search history.

(56) References Cited

U.S. PATENT DOCUMENTS

| | | | |
|---|---|---|---|
| 5,723,987 A | 3/1998 | Ronen | 326/81 |
| 5,926,056 A * | 7/1999 | Morris et al. | 327/333 |
| 5,933,027 A * | 8/1999 | Morris et al. | 326/81 |
| 6,130,556 A | 10/2000 | Schmitt | 326/81 |
| 6,144,221 A | 11/2000 | Oshima | 326/80 |
| 6,150,843 A * | 11/2000 | Shiffer et al. | 326/80 |
| 6,194,923 B1 * | 2/2001 | Dicke | 327/112 |
| 6,252,423 B1 | 6/2001 | Oshima | 326/80 |
| 6,323,684 B1 | 11/2001 | Oshima | 326/81 |
| 6,388,475 B1 | 5/2002 | Clark et al. | 327/108 |
| 6,573,765 B2 | 6/2003 | Bales et al. | 327/108 |
| 6,714,043 B1 | 3/2004 | Sharpe-Geisler | 326/39 |

FOREIGN PATENT DOCUMENTS

JP         07066710         3/1995

* cited by examiner

*Primary Examiner*—Don Le
(74) *Attorney, Agent, or Firm*—Schneck & Schneck; Thomas Schneck

(57) ABSTRACT

An input/output (I/O) buffer having an input mode and coupled between first and second supply voltages includes a PMOS pull-up transistor fabricated in an nwell, and a gate bias control transistor coupled to the gate of the PMOS pull-up transistor for coupling the gate of the PMOS pull-up transistor to an input/output node in response to an input signal having a voltage greater than approximately the first supply voltage. A well bias control circuit is coupled to the PMOS pull-up transistor and to a well drive transistor to couple the nwell terminal to the first supply voltage in response to the input signal having a voltage approximately equal to or less than the first supply voltage.

18 Claims, 7 Drawing Sheets

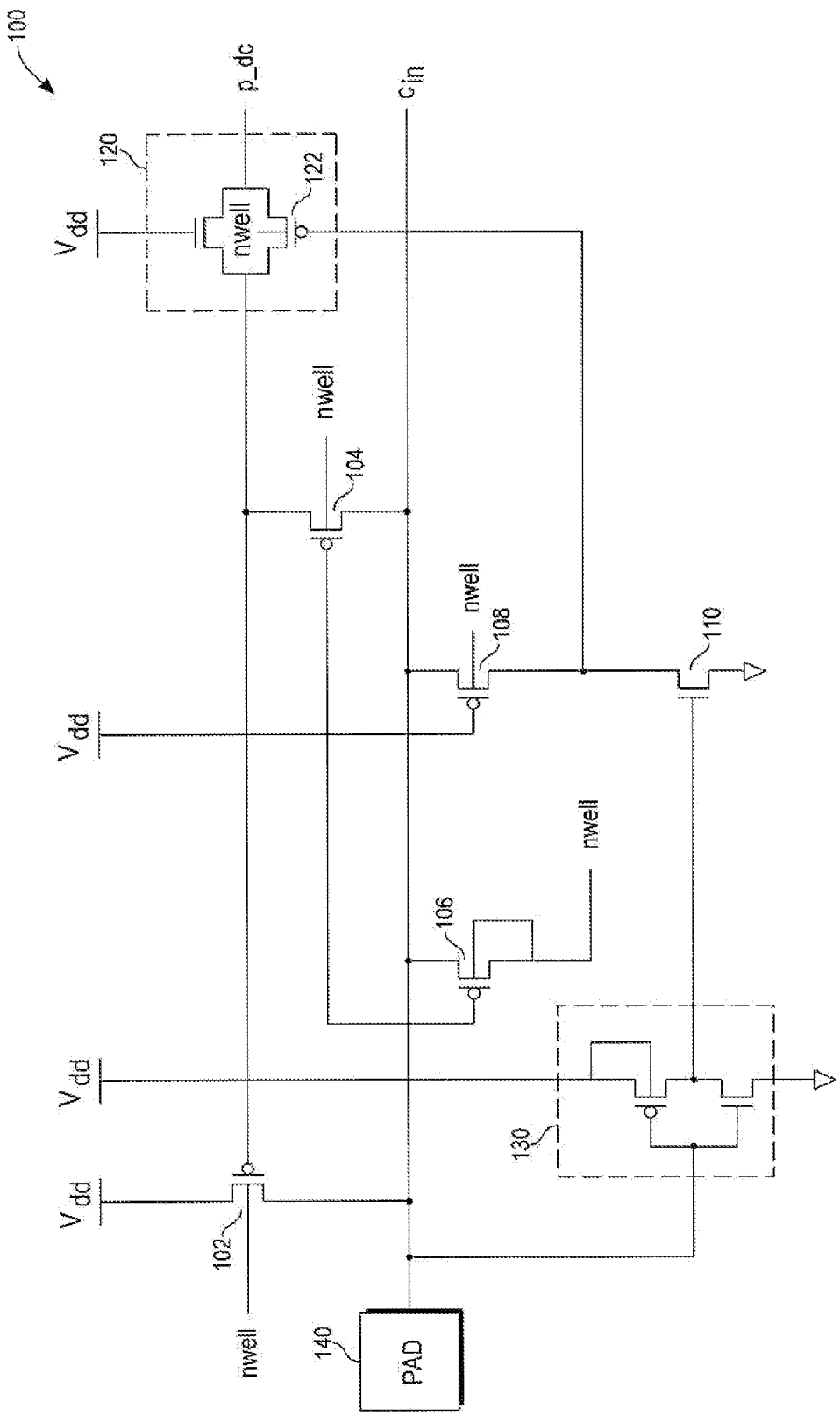
Fig._1 (Prior Art)

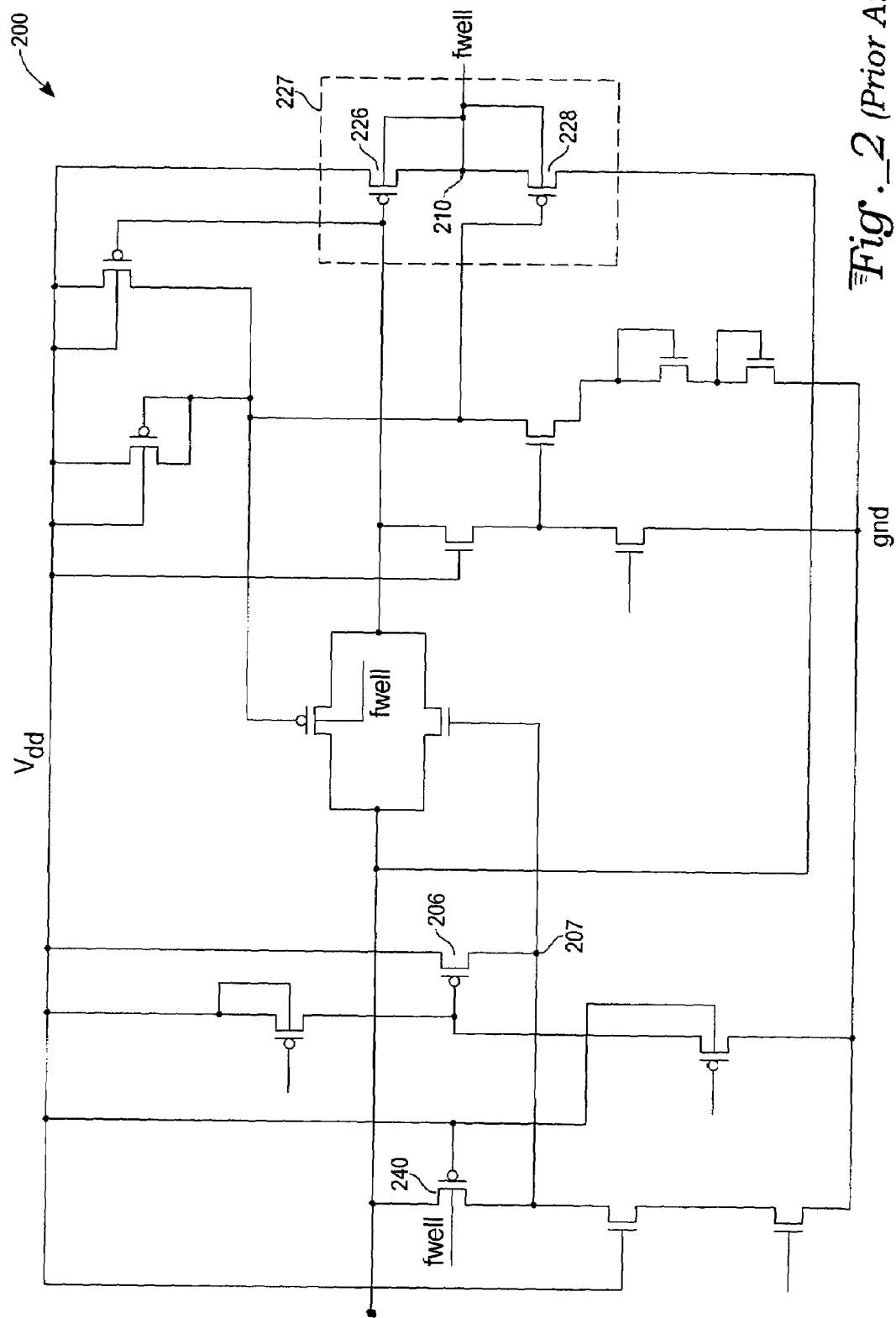
Fig._2 (Prior Art)

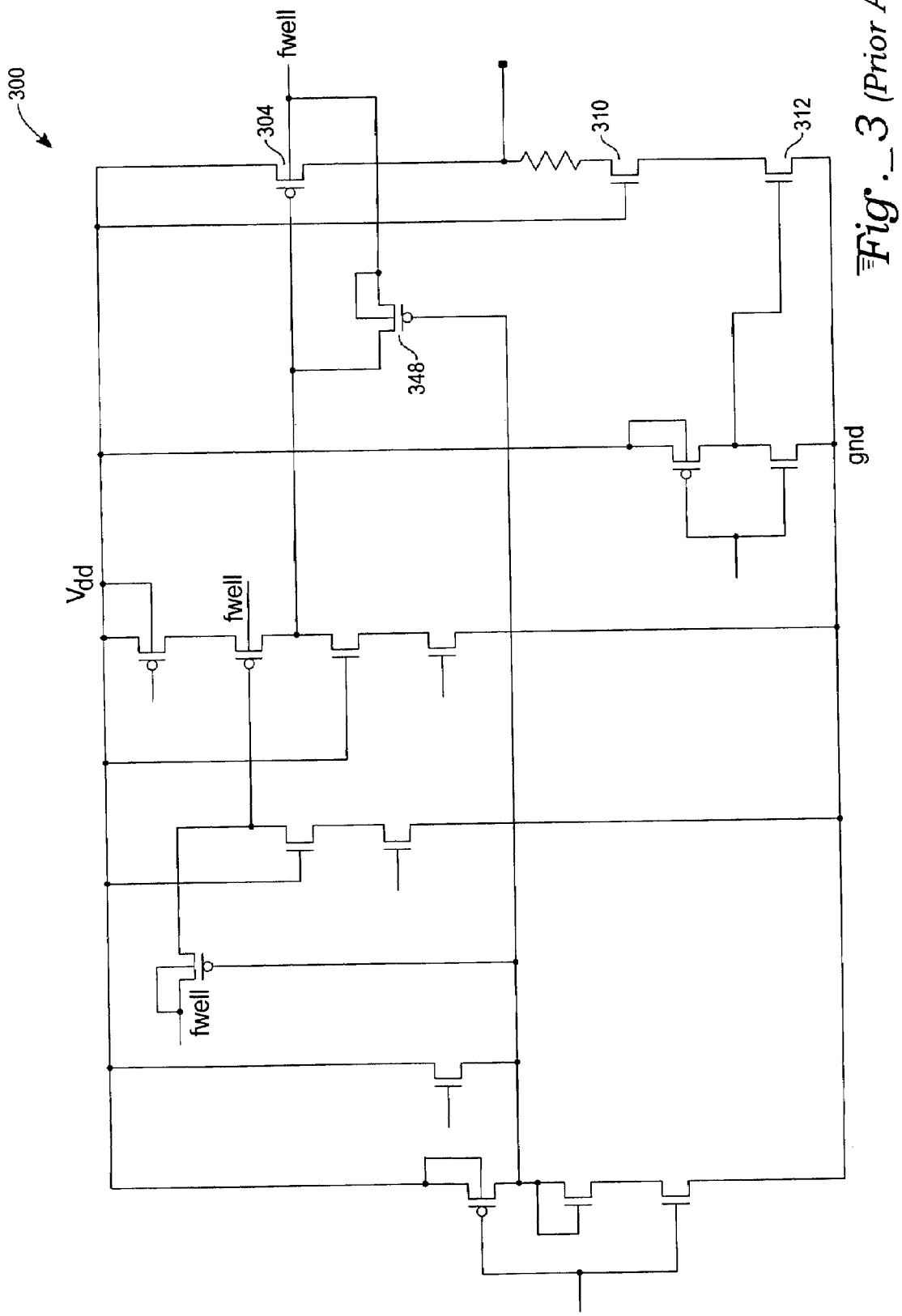
Fig._3 (Prior Art)

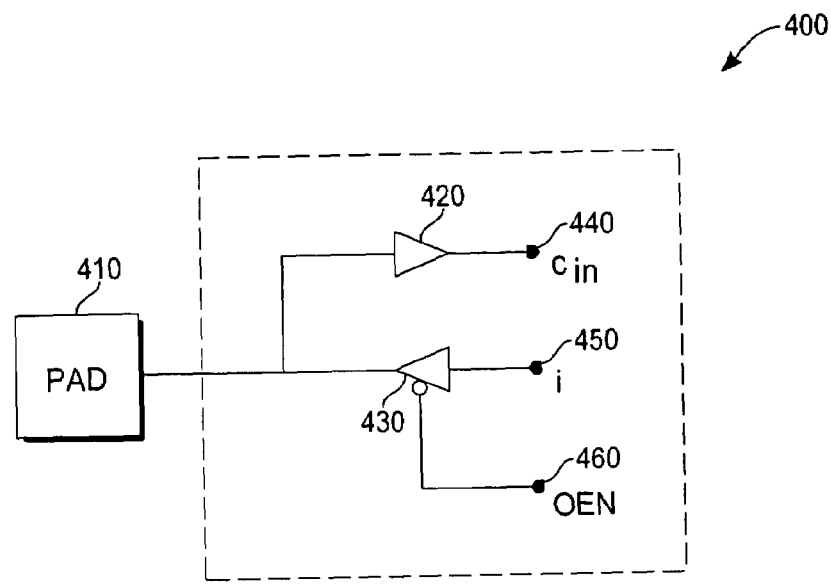
*Fig._4*
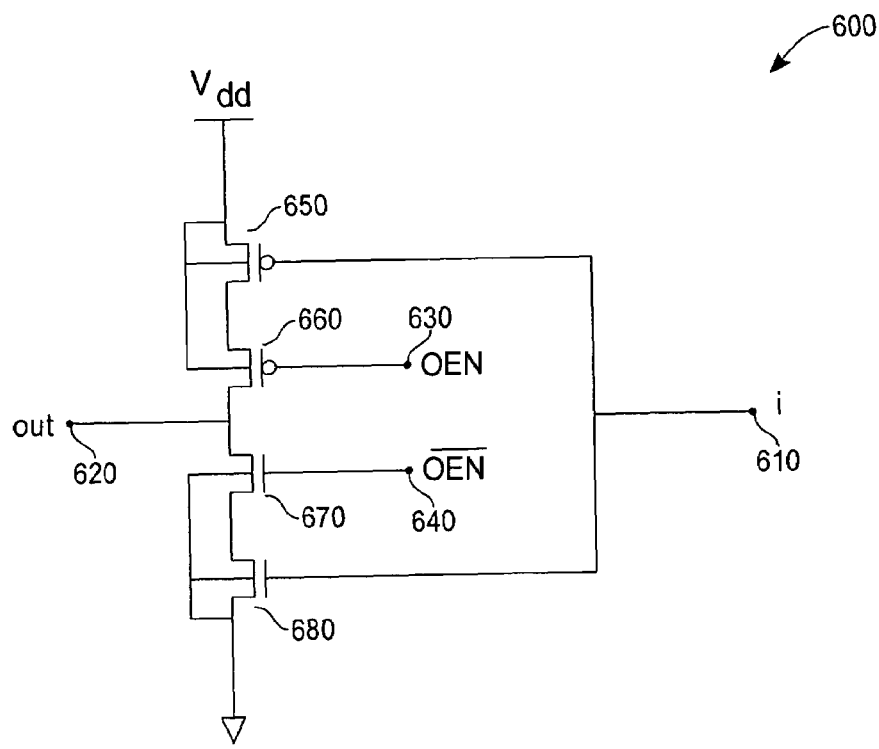
*Fig._6*

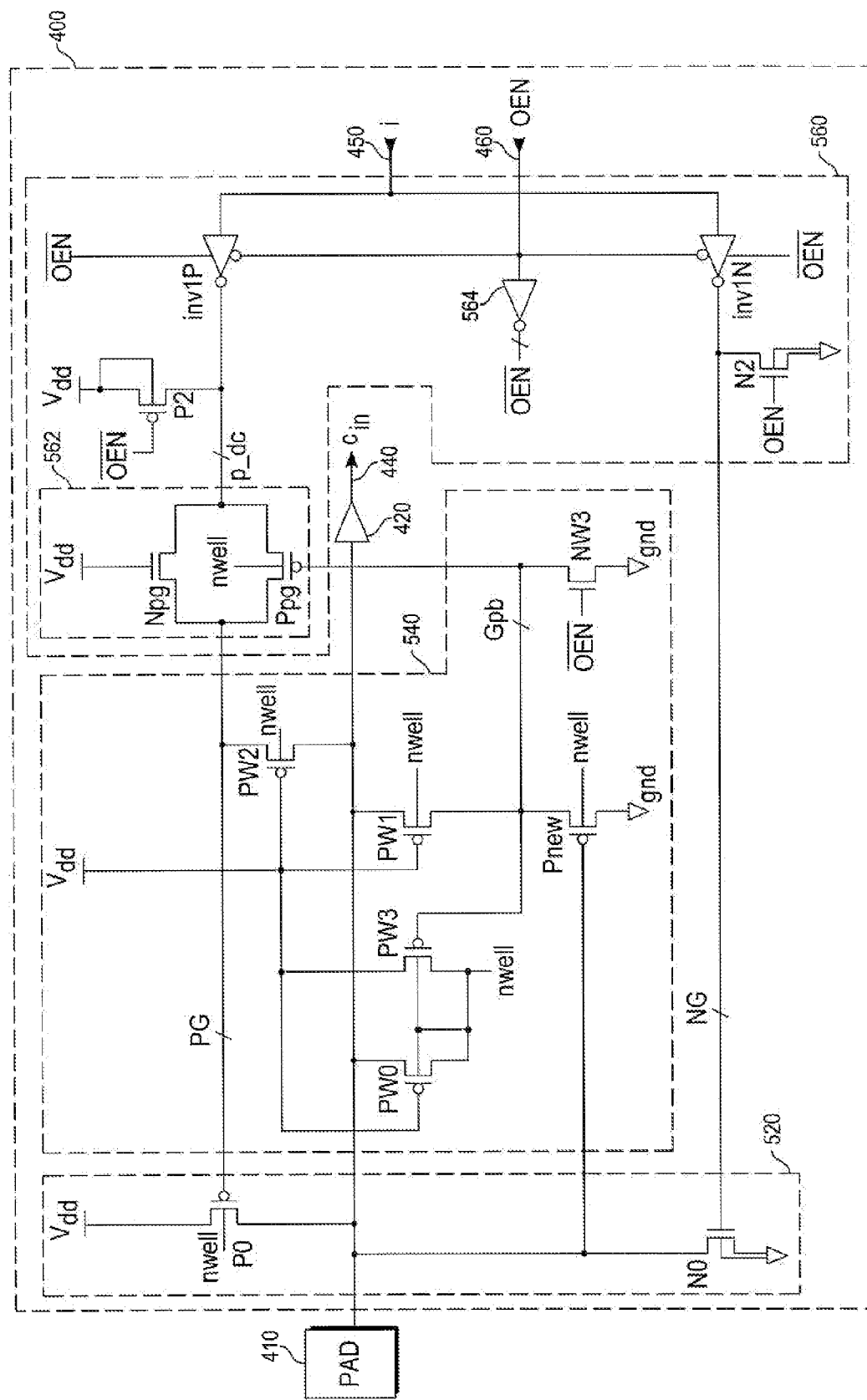
Fig._5

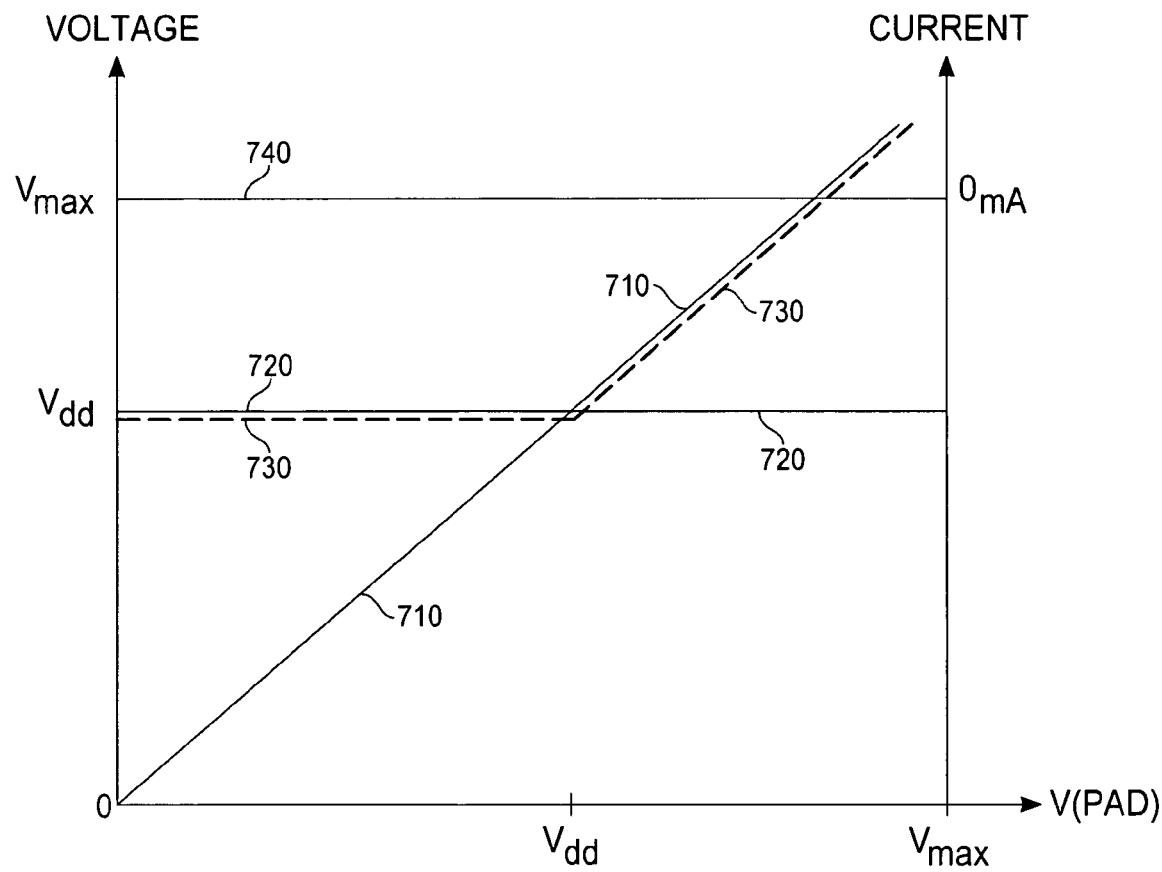
Fig. _7

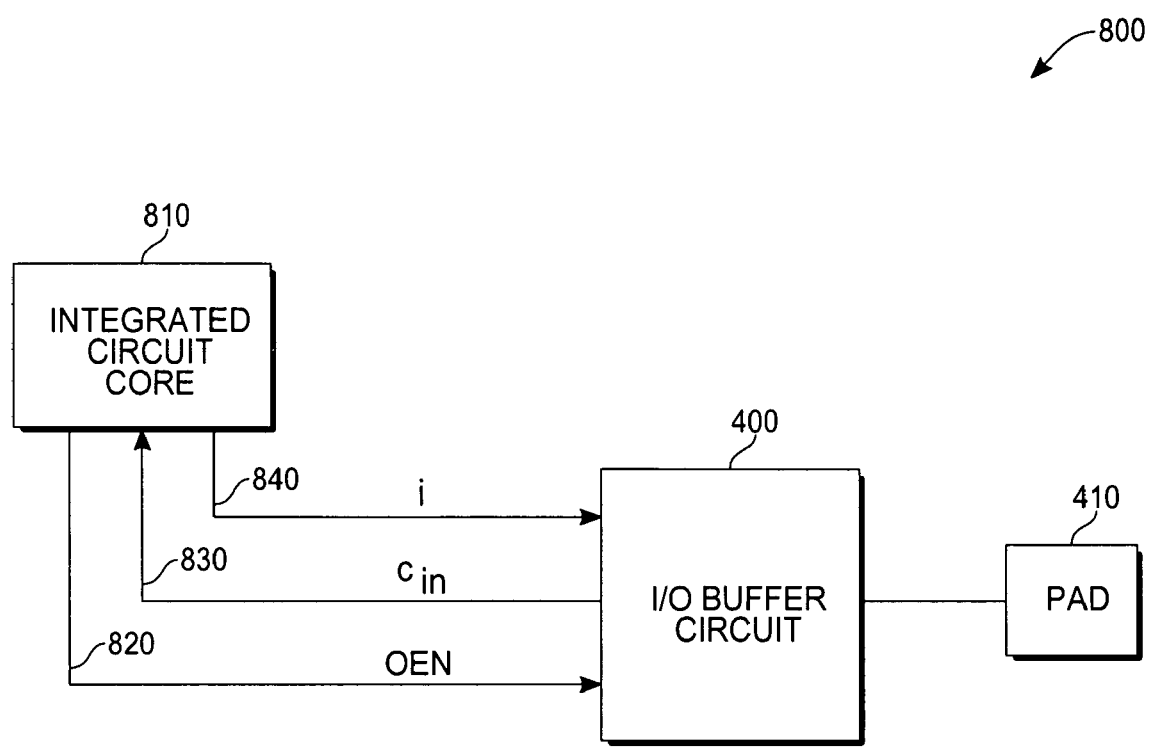
Fig._8

VOLTAGE TOLERANT STRUCTURE FOR I/O CELLS

TECHNICAL FIELD

The present invention is related to integrated circuits. More specifically, the present invention is an input-output (I/O) buffer circuit having a tolerance for input voltages which exceed the power supply potential.

BACKGROUND ART

Process technology advances in integrated circuit fabrication have led to more compact chip designs. Typically, as a process technology scales the physical dimensions of a chip, the associated power supply voltages are reduced as well. This reduction is necessary to prevent damage to devices from signals exceeding physical limitations on voltages and electric fields, and to reduce the overall power consumption. Trends in CMOS power supply scaling have progressed from operating voltages of 5 volts, typical for a 0.35 μm process technology, to 3.3, 2.4, and even 1.8 volts as the feature size has reduced to 90 nm.

Within the interior of the integrated circuit, the reduced operating voltages usually provide benefits in terms of power, thermal dissipation, and other performance attributes. However, the integrated circuit must necessarily be interfaced to other circuits and systems, oftentimes operating with signals at higher voltages. It is a task of the input-output (I/O) buffer circuit to provide this interface. As an example, it may be desirable to interface an integrated circuit which operates from a 2.4 volt power supply to a system having transistor-transistor logic (TTL) compatible inputs operating at nominally 5 volts. Thus, a need exists for an I/O buffer circuit which can tolerate applied voltages exceeding the circuit's power supply voltage. For the purpose of this specification, circuits having the capability of operating on signal voltages which exceed the power supply potential will be termed voltage tolerant. Not only is it desirable for a voltage tolerant buffer circuit to withstand elevated voltages without damage, but also to prevent excessive currents resulting from the applied signals. This is necessary to limit power consumption within the system and to reduce other potentially deleterious effects such as electromagnetic interference (EMI) which can result from excessive current transients.

FIG. 1 shows a schematic diagram of a portion of a voltage tolerant I/O buffer circuit as known in the prior art. An I/O circuit portion 100 is comprised of a PMOS pull-up transistor 102, a passgate 120, PMOS transistors 104, 106, and 108, a PMOS passgate transistor 122, an NMOS transistor 110, and an inverter 130. The I/O circuit portion 100 is coupled to a first power supply potential $V_{dd}$, a second power supply potential gnd, and a pad 140. The PMOS pull-up transistor 102 provides means to raise the output voltage on the pad 140 when the circuit is operated in an output mode. The gate of the PMOS pull-up transistor 102 is controlled by a signal p_dc which is propagated through the passgate 120, the passgate 120 being coupled to the gate terminal of the PMOS pull-up transistor 102. When the circuit is operated in an input mode and the potential applied to the pad 140 exceeds the first power supply potential $V_{dd}$, the PMOS transistors 104 and 106 begin to conduct, raising the potential on the gate terminal of the PMOS pull-up transistor 102 and nwell signal potential, respectively. In addition, the PMOS transistor 108 begins to conduct, raising the gate terminal potential of the PMOS passgate transistor 122. Both the nwell signal potential and the gate terminal potential of the passgate transistor 122 will rise above the first power supply potential $V_{dd}$, tracking the potential applied to the pad, effectively biasing the PMOS passgate transistor 122 to an off condition. The NMOS transistor 110 provides means for pulling the gate terminal of the PMOS passgate transistor 122 to the second power supply potential gnd. The NMOS transistor 110 is controlled by the inverter 130 which is coupled to the input pad 140. A disadvantage to the configuration of the I/O circuit portion 100 is the existence of a parasitic or "shoot through" current being induced in the inverter 130 when an input potential intermediate between the second power supply potential gnd and first power supply potential $V_{dd}$ is applied to the pad. This could be especially troublesome if the pad is placed in a tri-state condition by the external system, allowing the pad potential to float at an uncontrolled level. Tri-state conditions are commonly employed on signal lines and data busses as a power-saving measure and to provide an intermediate condition when the line or bus is transitioning from an input to output condition or vice versa. It is evident from FIG. 1 that a means for providing pull-down on the gate terminal of the PMOS passgate transistor 120 without the limitations imposed by inverter 130 is desirable.

FIG. 2 shows a schematic diagram of a well pulling circuit 200 as known in the prior art, from U.S. Pat. No. 6,573,765 B2 to Bales et al. The well pulling circuit is coupled to a first power supply potential $V_{dd}$ and a second power supply potential GND. Attention is directed to PMOS transistor 226 and PMOS transistor 228 which comprise an FWELL switch circuit 227 for the purpose of controlling the potential of a signal FWELL which is coupled to an output node 210. Column 5, lines 9 through 15 of the '765 specification state: "During the transition between the deactivation/activation of the PMOS transistors 226 and 228, current will flow through the FWELL switch 227. However, it will be appreciated that the dimensions of transistors 226 and 228 should be selected such that large transition currents are minimized, but the output node 210 can still be charged and discharge quickly enough to track a fast transitioning signal." Column 5, lines 16 through 26 of the '765 specification further describe conditions which bias PMOS transistor 240 to couple node 207 to the input pad, causing a static current in PMOS transistor 206.

FIG. 3, from the '765 patent to Bales et al., shows an output driver circuit 300 for use in conjunction with the well pulling circuit of FIG. 2. The output driver is coupled to a first power supply potential $V_{dd}$, a second power supply potential GND, and to the FWELL signal (FIG. 2). Attention is directed to a PMOS balancing transistor 348 which is employed to couple the bulk terminal and the gate terminal of a PMOS pull-up transistor 304. The PMOS balancing transistor 348 comprises the means by which the gate terminal of the PMOS pull-up transistor 304 is raised above the power supply potential. The pull-down function for the output driver is accomplished by means of an NMOS pull-down transistor 310 and an NMOS pull-down transistor 312 which are serially connected to comprise a stacked configuration.

Typical I/O buffer circuits include a PMOS pull-up transistor for the purpose of driving logic high data output signals. The PMOS transistor is attractive as a pull-up device because its current-voltage behavior results in the device exhibiting low series resistance and excellent current drive when used to couple a signal line to a positive power supply potential. A disadvantage to the device is that it is held in the off condition by means of applying a positive potential, typically the power supply potential, to its gate terminal. If a potential exceeding the power supply potential is applied to the drain of the device, it will begin to conduct, providing a current path from the drain to the source. This may disrupt the applied signal level, and in the extreme will induce variations of the power supply potential. What is needed is a circuit design which enables PMOS transistors to be employed as pull-up devices without undesirable conduction paths when the input potential of an I/O buffer circuit exceeds the power supply potential. Furthermore, the circuit should be simple in order to conserve valuable space on the chip and should have well-behaved transition characteristics between its various operating modes, minimizing shoot-through currents, leakage currents, or other current-voltage extremes.

SUMMARY OF THE INVENTION

The goals of providing a simple I/O buffer circuit with tolerance to input voltages exceeding the power supply potential and avoiding parasitic conduction paths have been met in the present invention. In an exemplary embodiment of the present invention, a single circuit combines a CMOS inverter/output driver, an Nwell bias block, a function control block, and an input buffer to create the I/O buffer circuit. The operating principle of the circuit is to provide a means by which the gate and bulk terminal potentials of several PMOS devices, in particular a PMOS pull-up transistor, can be raised above the power supply potential to enable the devices to remain in a non-conductive condition, even when subjected to voltages exceeding the power supply potential.

The approach of the present invention avoids the complexity and performance limitations of the prior art by means of a simplified nwell biasing circuit, one feature of which is the application of a PMOS transistor as a pull-down device for controlling the gate potential of a PMOS passgate transistor in the control block. This enables the Nwell bias block to smoothly transition the nwell bias when raising the nwell potential above the supply potential in response to input voltages exceeding the supply potential.

In an input mode of the buffer circuit, the gate potential of the PMOS pull-up device is raised above the first power supply potential $V_{dd}$ by coupling the gate to the input signal from the pad when the input signal exceeds a first power supply potential $V_{dd}$. This approach improves the response time of the circuit by avoiding the need to fully charge the nwell in order to track the input potential. The Nwell biasing block provides several paths for raising the nwell potential above $V_{dd}$ by means of parasitic pn diodes in PMOS devices coupled to the pad input signal. The circuit is immune to current shoot through conditions during the charging and discharging of the nwells.

BRIEF DESCRIPTION OF THE DRAWINGS

FIG. 1 is a schematic diagram of a portion of a voltage tolerant I/O buffer circuit as known in the prior art.

FIG. 2 is a schematic diagram of a well pulling circuit as known in the prior art.

FIG. 3 is an output driver circuit as known in the prior art for use in conjunction with the well pulling circuit of FIG. 2.

FIG. 4 is a block diagram illustrating the Boolean functionality of an I/O buffer circuit according an exemplary embodiment of the present invention.

FIG. 5 is a schematic diagram of an I/O buffer circuit according to an exemplary embodiment of the present invention.

FIG. 6 is a schematic diagram of a tri-state capable inverter.

FIG. 7 is the electrical relationship of selected circuit nodes as a function of the input signal applied to a pad attached to a voltage tolerant circuit according to an exemplary embodiment of the present invention.

FIG. 8 shows a block diagram of an integrated circuit using the present invention.

DETAILED DESCRIPTION OF THE INVENTION

In the discussions infra, it will be appreciated by those skilled in the art that MOSFET transistors are typically configured as symmetrical devices, and consequently the interchange of the terminals named source and drain has no effect on the operation of the device. In conventional nomenclature, an electrical current is presumed to flow into the source terminal of a PMOS transistor, and out from the source terminal of an NMOS transistor. However, certain applications render the terminology ambiguous. One example is a passgate which may experience control current flow in both directions through the devices comprising the passgate. For this reason, although the terms source and drain are applied infra, it is to be understood that they are not intended as limiting with respect to the direction of current through a device. Rather, the direction of current is to be understood on the basis of the bias potentials applied to the device terminals.

It is to be further appreciated by those skilled in the art of digital circuit design that a commonly employed lexicon equates electrical potential and digital logic (Boolean) values. Thus, the terms logic low, logic zero, ground potential, and zero volts may be understood to be equivalent in the context of a digital circuit. Analogously, the terms logic high, logic one, supply potential, and $V_{dd}$ may have similar equivalence. The descriptions infra assume this lexical equivalence. Additionally, the terms potential and voltage are used interchangeably by those skilled in the art and are assumed to be equivalent in this specification.

With reference to FIG. 4, an exemplary embodiment of an input-output (I/O) buffer circuit 400 is coupled to a pad 410 which provides an electrical connection point and external interface. The I/O buffer circuit 400 comprises an input buffer 420, an output driver and control block 430, a circuit data input pin 440, an output data pin 450, and an output enable not pin 460. The pad 410 is coupled to an input of the input buffer 420, which has an output terminal coupled to the circuit data input pin 440.

When the I/O buffer circuit 400 is operating in an input mode, a signal OEN, applied to the output enable not pin 460, is held at logic high. The output enable not pin 460 is coupled to the output driver and control block 430. When the OEN signal is asserted high, the output driver and control block 430 is disabled, and does not attempt to drive an output value onto the pad 410. Any signals present on the output data pin 450 are ignored and have no effect. External signals applied to the pad 410 are routed by the input buffer 420 to the circuit data input pin 440, producing a signal $c_{in}$ for use by circuits attached to the circuit data input pin 440. The function of the input buffer 420 is to replicate the logical value of input signals applied to the pad 410, while ensuring that the electrical load placed on the pad 410 and the voltage levels of the signal $c_{in}$ are controlled. If the pad 410 is placed into a tri-state condition in this mode, the signal $c_{in}$ is undefined, i.e., a logical "X" value.

When the I/O buffer circuit 400 is operating in an output mode, the signal OEN is held at logic low, enabling the output driver and control block 430. The output data pin 450 is coupled to an input of the output driver and control block 430. An output of the output driver and control block 430 is coupled to the pad 410 and to the input of the input buffer 420. A data signal "i" presented to the output data pin 450 propagates through the output driver and control block 430 to the pad 410. The signal also propagates through the input buffer 420 to the data input pin 440 and will be available as the signal $c_{in}$.

The combined actions of the operation of the I/O buffer circuit 400 for the input mode and the output mode may be summarized in the following truth table:

| Input | | I/O | Output |
|---|---|---|---|
| OEN | i | PAD | $C_{in}$ |
| L | L | L | L |
| L | H | H | H |
| H | X | L | L |
| H | X | H | H |
| H | X | HIZ | X | where HIZ indicates a tri-state condition on the input pad 410.

With reference to FIG. 5, the I/O buffer circuit 400 is coupled to a first power supply potential $V_{dd}$, a second power supply potential gnd, and is further comprised of an output driver block 520, an Nwell bias block 540, and a function control block 560. The pad 410 provides an external electrical connection to the I/O buffer circuit 400. It will be appreciated by those skilled in the art that the pad 410 may incorporate additional circuits, e.g., for the purpose of providing protection against electrostatic discharge (ESD), or to multiplex additional input/output data paths to the output pad 410 for the purpose of minimizing the number of electrical pins on an integrated circuit. A plurality of such circuits is known to those skilled in the art, but is not included so as to avoid obscuring the relevant elements of the present invention.

Output driver block 520 is further comprised of a PMOS output transistor P0 and an NMOS output transistor N0. A main function of the I/O buffer circuit 400 is to enable input signals applied to the pad 410 to exceed the first power supply potential $V_{dd}$ without causing appreciable conduction in the PMOS output transistor P0, to be explained infra. The PMOS output transistor P0 has its source terminal coupled to the first power supply potential $V_{dd}$, its drain terminal coupled to the pad 410, its gate terminal coupled to a signal line PG, and its bulk terminal coupled to a signal line nwell. When the I/O buffer circuit 400 is operating in an output mode, the PMOS output transistor P0 functions as a pull-up device, providing a means for raising the potential on the pad 410 to approximately the first power supply potential $V_{dd}$ when the output transistor P0 is biased into conduction. The NMOS output transistor N0 has its drain terminal coupled to the pad 410, its source and bulk terminals coupled together and to the second power supply potential gnd, and its gate terminal coupled to a signal line NG. When the I/O buffer circuit 400 is operating in an output mode, the NMOS output transistor N0 functions as a pull-down device, providing a means for reducing the potential on the pad 410 to approximately the second power supply potential gnd when the NMOS output transistor N0 is biased into conduction.

The Nwell bias block 540 further comprises a PMOS Nwell bias transistor PW0, a PMOS gate bias pull-up transistor PW1, a PMOS PG bias transistor PW2, a PMOS Nwell drive transistor PW3, a PMOS gate bias pull-down transistor Pnew, and an NMOS output mode pull-down transistor NW3. The PMOS Nwell bias transistor PW0 has its source terminal coupled to the pad 410 and its gate terminal coupled to the first power supply potential $V_{dd}$.

The drain terminal and the bulk terminal of the PMOS Nwell bias transistor PW0 are coupled to each other and to the bulk terminal and the drain terminal of the PMOS Nwell drive transistor PW3. The drain terminal and the bulk terminal of the PMOS Nwell bias transistor PW0 and the drain terminal and the bulk terminal of PMOS Nwell drive transistor PW3 are coupled to the signal line nwell. The source terminal of the PMOS Nwell drive transistor PW3 is coupled to the first power supply potential $V_{dd}$. The gate terminal of the PMOS Nwell drive transistor PW3 is coupled to a signal line Gpb. The PMOS gate bias pull-up transistor PW1 has its source terminal coupled to the input pad 410, its drain terminal coupled to the signal line Gpb, its gate terminal coupled to the first power supply potential $V_{dd}$, and its bulk terminal coupled to the signal line nwell.

The PMOS PG bias transistor PW2 has its gate terminal coupled to the first power supply potential $V_{dd}$, its source terminal coupled to the pad 410, its drain terminal coupled to the signal line PG, and its bulk terminal coupled to the signal line nwell. The PMOS gate bias pull-down transistor Pnew has its gate terminal coupled to the pad 410, its source terminal coupled to the signal line Gpb, its drain terminal coupled to the second power supply potential gnd, and its bulk terminal coupled to the signal line nwell. The NMOS output mode pull-down transistor NW3 has its gate terminal coupled to a signal line $\overline{OEN}$, its drain terminal coupled to the signal line Gpb, and its source terminal and its bulk terminal coupled to the second power supply potential gnd.

The function control block 560 further comprises a passgate 562, a PMOS enable control transistor P2, an NMOS enable control transistor N2, a tri-state capable PG inverter inv1P, a tri-state capable NG inverter inv1N, and an OEN inverter 564. The passgate transistor Npg and a PMOS passgate transistor Ppg. The NMOS passgate transistor Npg has its gate terminal coupled to the first power supply potential $V_{dd}$, its drain terminal coupled the signal line PG, and its source terminal coupled to a signal line p_dc. The PMOS passgate transistor Ppg has its gate terminal coupled to the signal line Gpb, its bulk terminal coupled to the signal line nwell, its drain terminal coupled to the signal PG, and its source terminal coupled to the signal line p_dc. The PMOS enable control transistor P2 has its source terminal coupled to its bulk terminal and to the first power supply potential $V_{dd}$. The gate terminal of PMOS enable control transistor P2 is coupled to the signal line $\overline{OEN}$, and the drain terminal of the PMOS enable control transistor P2 is coupled to the signal line p_dc. The NMOS enable control transistor N2 has its source terminal and its bulk terminal coupled to the second power supply potential gnd. The gate of the NMOS enable control transistor N2 is coupled to a signal line OEN and the drain of the NMOS enable control transistor N2 is coupled to the signal line NG. The signal OEN is further coupled to an input terminal of the OEN inverter 564 which performs a logical inversion of the input signal to produce an output signal. An output of the OEN inverter 564 is coupled to the signal line $\overline{OEN}$. The tri-state capable PG inverter inv1P and the tri-state capable NG inverter inv1N each have a control input coupled to the signal line OEN and to the signal line $\overline{\text{OEN}}$ and are both configured so as to enable them to be disconnected from the power supplies by the action of the signals OEN and $\overline{\text{OEN}}$. An input of tri-state capable PG inverter inv1P and an input of tri-state capable NG inverter inv1N are each coupled to the output data pin 450 to receive the data signal "i." An output of tri-state capable PG inverter inv1P is coupled to the signal line p_dc, and an output of tri-state capable inverter inv1 is coupled to the signal line NG.

Operation in Output Mode

When the I/O buffer circuit 400 is operated in an output mode, the signal OEN is driven to a logic low, i.e., to a value approximately equal to the second power supply potential gnd. The OEN inverter 564 will consequently output a logic high, approximately equal to the first power supply potential $V_{dd}$, on the signal line $\overline{\text{OEN}}$. The application of a logic low to the gate terminal of the NMOS enable control transistor N2 by means of the signal line OEN will cause the NMOS enable control transistor N2 to turn off. This releases the signal line NG from the influence of the NMOS enable control transistor N2 and permits the signal line NG to be controlled by the action of the tri-state capable NG inverter inv1N. In analogous fashion, the application of a logic high to the gate terminal of the PMOS enable control transistor P2 by means of the signal line $\overline{\text{OEN}}$ will cause the PMOS enable control transistor P2 to turn off. When PMOS enable control transistor P2 turns off, the signal line PG is released from the influence of the PMOS enable control transistor P2 and permits the signal line p_dc to be controlled by the action of the tri-state capable PG inverter inv1P.

The application of a logical low by means of the signal OEN to the tri-state capable PG inverter inv1P and the tri-state capable NG inverter inv1N causes the tri-state capable PG inverter inv1P and the tri-state capable NG inverter inv1N to become coupled to the first power supply potential $V_{dd}$ and to the second power supply potential gnd. In this condition, the tri-state capable PG inverter inv1P and the tri-state capable NG inverter inv1N will operate on data signal "i", outputting the logical inverse of the data signal "i."

Attention is now directed to the operating condition of the PMOS Nwell bias transistor PW0, the PMOS gate bias pull-up transistor PW1, and the PMOS PG bias transistor PW2: Since the gate terminals of each of the devices are connected to the first power supply potential $V_{dd}$, and since the I/O buffer circuit 400 when configured for the output mode has no connection to an electrical potential which exceeds the first power supply potential $V_{dd}$, the PMOS Nwell bias transistor PW0, PMOS gate bias pull-up transistor PW1, and PMOS PG bias transistor PW2 are biased in an off condition.

We now separately consider the effect of applying a logic high and a logic low to the output data pin 450. Application of a logic high to the output data pin 450 results in the signal line p_dc being held at logic low by the tri-state capable PG inverter inv1P. The signal line PG is pulled to a logic low substantially by means of the NMOS passgate transistor Npg which is biased into conduction by the application of the first power supply potential $V_{dd}$ to its gate terminal. In the on condition, the NMOS passgate transistor Npg couples the signal line PG to the signal line p_dc, forcing the signal line PG to the same potential as the signal line p_dc. In turn, application of a logic low to the gate of the PMOS output transistor P0 by means of signal line PG will cause the PMOS output transistor P0 to conduct, thereby coupling the first power supply potential $V_{dd}$ to the pad 410, resulting in a logic high condition on the pad 410. Thus, the logic high applied to the output data pin 450 propagates to the pad 410.

Considering portions of the I/O buffer circuit 400 not yet analyzed illustrates that the remainder of the circuit operates without conflict to the desired output: Application of a logic high to the output data pin 450 results in the signal line NG being held at logic low by the tri-state capable NG inverter inv1N. In turn, application of a logic low to the gate of the NMOS output transistor N0 by means of the signal line NG causes the NMOS output transistor N0 to turn off, thereby enabling the output pad 410 to be driven to the logic high condition by the PMOS output transistor P0. The action of the PMOS output transistor P0 and the NMOS output transistor N0 in combination are therefore consistent with typical operation of an inverting CMOS output driver circuit.

Turning attention to the PMOS gate bias pull-down transistor Pnew, the gate terminal of the PMOS gate bias pull-down transistor Pnew is biased at approximately the first power supply potential $V_{dd}$ when the output pad 410 is driven to the logic high condition, causing the PMOS gate bias pull-down transistor Pnew to turn off. The application of a logic high to the gate terminal of the NMOS output mode pull-down transistor NW3 by signal $\overline{\text{OEN}}$ biases the NMOS output mode pull-down transistor NW3 into conduction, pulling the potential on the signal line Gpb to approximately the second power supply potential gnd.

Turning attention now to the PMOS Nwell drive transistor PW3, we note that since the signal line Gpb is at approximately the second power supply potential gnd, the PMOS Nwell drive transistor PW3 is biased into conduction, coupling the signal line nwell to the first power supply potential $V_{dd}$.

Application of a logic low to the output data pin 450 results in the signal line p_dc being pulled to logic high by the tri-state capable PG inverter inv1P. The signal line PG is pulled to a logic high substantially by means of the PMOS passgate transistor Ppg which will be shown, infra, to be biased into conduction. In the on condition, the PMOS passgate transistor Ppg couples the signal line PG to the signal line p_dc, forcing the signal line PG to approximately the same potential as the signal line p_dc. In turn, application of a logic high to the gate of the PMOS output transistor P0 by means of the signal line PG causes the PMOS output transistor P0 to turn off, thereby uncoupling the first power supply potential $V_{dd}$ from the pad 410. Application of the logic low to the output data pin 450 results in the signal line NG being held at logic high by the tri-state capable NG inverter inv1N. In turn, application of a logic high to the gate of the NMOS output transistor N0 by means of the signal line NG causes the NMOS output transistor N0 to turn on, pulling the potential of the output pad 410 to approximately the second power supply potential gnd. The action of the PMOS output transistor P0 and the NMOS output transistor N0 in combination are again seen to provide operation typical of an inverting CMOS output driver circuit. A condition of the remaining circuit components is now analyzed to demonstrate proper operation. Since the pad 410 is biased to approximately the second power supply potential gnd, the gate terminal of the PMOS gate bias pull-down transistor Pnew is also at approximately the second power supply potential gnd and the gate bias pull-down transistor Pnew is biased into conduction. Moreover, since signal $\overline{\text{OEN}}$ is at logic high, the NMOS NMOS output mode pull-down transistor NW3 is also biased into conduction. Biasing the PMOS gate bias pull-down transistor Pnew and the NMOS output mode pull-down transistor NW3 into conduction results in the signal line Gpb being pulled toward the second power supply potential gnd, in turn causing the PMOS Nwell drive transistor PW3 and the PMOS passgate transistor Ppg to be biased into conduction. The signal line nwell is thereby coupled to the first power supply potential $V_{dd}$ by the PMOS Nwell drive transistor PW3, causing the potential on the signal line nwell to increase to approximately the first power supply potential $V_{dd}$. The on condition of the PMOS passgate transistor Ppg results in an efficient coupling of the signal line p_dc to the signal line PG, producing a pull-up of the signal line PG to approximately the first power supply potential $V_{dd}$. Those skilled in the art will recognize that although the NMOS passgate transistor Npg is also biased into conduction, an NMOS device is less efficient than a PMOS device for pull-up of a signal line.

Operation in Input Mode

When I/O buffer 400 is to be operated in an input mode, the signal line OEN is driven to a logic high, i.e., to a value approximately equal to the first power supply potential $V_{dd}$. The OEN inverter 564 (FIG. 5) will consequently output a logic low, approximately equal to the second power supply potential gnd, on the signal line $\overline{\text{OEN}}$. The application of a logic high to the gate terminal of the NMOS enable control transistor N2 by the signal line OEN will cause the NMOS enable control transistor N2 to conduct. This will pull the signal line NG to approximately the second power supply potential gnd. In analogous fashion, the application of a logic low to the gate terminal of the PMOS enable control transistor P2 by the signal line $\overline{\text{OEN}}$ causes the PMOS enable control transistor P2 to conduct. Once the PMOS enable control transistor P2 conducts, the signal line PG is pulled to approximately the first power supply potential $V_{dd}$.

The application of a logical high by means of the signal line OEN and simultaneous application of a logical low by means of the signal line $\overline{\text{OEN}}$ to the tri-state capable PG inverter inv1P and the tri-state capable NG inverter inv1N causes the tri-state capable PG inverter inv1P and the tri-state capable NG inverter inv1N to be disconnected from the first power supply potential $V_{dd}$ and from the second power supply potential gnd. In this condition, the tri-state capable PG inverter inv1P and the tri-state capable NG inverter inv1N will ignore signals present on the output data pin 450, and their outputs will float. The signal line $\overline{\text{OEN}}$ at logical low causes the NMOS output mode pull-down transistor NW3 to be biased off, and therefore the NMOS output mode pull-down transistor NW3 has no influence on the potential of the signal line Gpb.

Since the signal line NG is at approximately the second power supply potential gnd, the NMOS output transistor N0 is biased off and will not influence the potential on the pad 410. Similarly, it will be shown, infra, that the signal line PG is held at a potential approximately equal or greater than the first power supply potential $V_{dd}$, which ensures that the PMOS output transistor P0 is biased off. Hence, the output driver block 520 exerts no influence on the pad 410 when I/O buffer circuit 400 is operated in the input mode.

Consideration is now made to three input conditions on the pad 410:
 i. Input condition at the second power supply potential gnd;
 ii. Input condition at the first power supply potential $V_{dd}$; and
 i. Input condition at a potential exceeding the first power supply potential $V_{dd}$.

i. Input Condition at the Second Power Supply Potential gnd

Consideration is first made to a case where the input condition of the pad is a logic low, i.e., at the second power supply potential gnd. Attention is directed to the operating condition of the PMOS Nwell bias transistor PW0, the PMOS gate bias pull-up transistor PW1, and the PMOS PG bias transistor PW2. Since the gate terminals of each of the devices are connected to the first power supply potential $V_{dd}$, and since the pad 410 is at the second power supply potential gnd, the PMOS Nwell bias transistor PW0, PMOS gate bias pull-up transistor PW1, and PMOS PG bias transistor PW2 are biased in an off condition and do not influence the behavior of the I/O buffer circuit 400. The gate terminal of the PMOS gate bias pull-down transistor Pnew will also be at approximately the second power supply potential gnd due to its coupling to the pad 410. This biases the PMOS gate bias pull-down transistor Pnew into conduction, pulling the signal line Gpb to approximately the second power supply potential gnd. Those skilled in the art will recognize that the utilization of the PMOS gate bias pull-down transistor Pnew for the pull-down of the signal line Gpb differs from the usual practice of employing an NMOS transistor as a pull-down device. If available, a PMOS device with a lower absolute threshold voltage than the absolute threshold voltage of the remaining PMOS devices of the I/O buffer circuit 400 is employed to implement the PMOS gate bias pull-down transistor Pnew in order to improve its current drive and lower its series resistance. In general, the lowest threshold voltage PMOS device available in the process technology used to fabricate the I/O buffer circuit 400 should be employed to implement the PMOS gate bias pull-down transistor Pnew. That is:

$$|V_{tp_{new}}| \leq |V_{tp}|$$

where $V_{tp_{new}}$ represents the threshold voltage of PMOS gate bias pull-down transistor Pnew and $V_{tp}$ represents the threshold voltages of the other PMOS devices represented in FIG. 5. The absolute value notation is employed to avoid ambiguity since PMOS devices are conventionally represented as having threshold voltages less than zero in value. As noted supra, the selection of a PMOS transistor having a characteristic of lowest absolute threshold voltage available among the PMOS devices comprising the I/O buffer circuit 400 improves the operation of this device.

Since the signal line Gpb is coupled to the gate terminal of the PMOS passgate transistor Ppg and to the gate terminal of the PMOS Nwell drive transistor PW3, the PMOS passgate transistor Ppg and the PMOS Nwell drive transistor PW3 will be biased into conduction. The on condition of the PMOS Nwell drive transistor PW3 couples the first power supply potential $V_{dd}$ to the signal line nwell, thereby setting the nwell/bias terminal potential of the PMOS output transistor P0, the PMOS gate bias pull-up transistor PW1, the PMOS PG bias transistor PW2, the PMOS passgate transistor Ppg, and the PMOS gate bias pull-down transistor Pnew to approximately the first power supply potential $V_{dd}$. Since the nwell/bias terminal potential of PMOS passgate transistor Ppg is at approximately the first power supply potential $V_{dd}$, and the gate terminal of the PMOS passgate transistor Ppg is at approximately the second power supply potential gnd, the PMOS passgate transistor Ppg is biased into conduction. Those skilled in the art will recognize that the bias conditions on the PMOS passgate transistor Ppg are favorable for action as a pull-up device, and that in this bias condition the PMOS passgate transistor Ppg efficiently couples the signal line p_dc to the signal line PG, resulting in a pull-up of the signal line PG to approximately the first power supply potential $V_{dd}$, as had been stated supra.

Since the source terminal of the PMOS Nwell drive transistor PW3 is tied to the first power supply potential $V_{dd}$, and the gate terminal of the PMOS Nwell drive transistor PW3 is coupled to the signal line Gpb with a potential approximately equal to the second power supply potential gnd, the PMOS Nwell drive transistor PW3 will be biased into conduction. This couples the signal line nwell, the bulk terminal of the PMOS Nwell bias transistor PW0, and the bulk terminal of the PMOS Nwell drive transistor PW3 to approximately the first power supply potential $V_{dd}$.

The logic low input signal applied to the pad 410 is coupled to the input buffer 420. The output of the input buffer 420 is a logic low applied to the signal line $c_{in}$, with a potential approximately equal to the second power supply potential gnd. It will be appreciated by those skilled in the art that a plurality of configurations are possible for input buffer 420 and that the exact choice does not affect the present invention. In the exemplary embodiment of the present invention, the input buffer 420 comprises a first CMOS inverter stage coupled in series with a second CMOS inverter stage. Thus, the inverted output from the first CMOS inverter stage is logically complemented by the second CMOS inverter stage such that the output from the input buffer 420, i.e., the signal line $c_{in}$, is the Boolean equivalent to the signal applied to the pad 410.

ii. Input Condition at the First Power Supply Potential $V_{dd}$

We next consider a case where the input condition of the pad 410 is a logic high equal to the first supply potential $V_{dd}$. Attention is again directed to the operating condition of the PMOS Nwell bias transistor PW0, the PMOS gate bias pull-up transistor PW1, and the PMOS PG bias transistor PW2. Since the gate terminals of each of the devices is connected to the first power supply potential $V_{dd}$, and since the pad 410 is at the first power supply potential $V_{dd}$, the PMOS Nwell bias transistor PW0, PMOS gate bias pull-up transistor PW1, and PMOS PG bias transistor PW2 are biased in an off condition and do not influence the behavior of the I/O buffer circuit 400. The gate terminal of the PMOS gate bias pull-down transistor Pnew will also be at approximately the first power supply potential $V_{dd}$ due to its coupling to the pad 410. This biases the PMOS gate bias pull-down transistor Pnew into an off condition. Consequently, the signal line Gpb is effectively floating. Since the signal line Gpb is coupled to the gate terminal of the PMOS Nwell drive transistor PW3 and to the gate terminal of the PMOS passgate transistor Ppg, the bias condition of these devices is indeterminate. The NMOS passgate transistor Npg will weakly couple the signal line p_dc to the signal line PG, thereby biasing the PMOS output transistor P0 off. However, since both the source terminal and the drain terminal of the PMOS output transistor P0 are at approximately the circuit supply potential $V_{dd}$ in this case, the gate bias of the PMOS output transistor P0 is not important and no current will exist in the device.

Turning attention now to PMOS Nwell drive transistor PW3, we note that although the bias condition of the gate terminal of the transistor PW3 is unknown, the potential of the signal line nwell can be determined from consideration of other transistors. Specifically, the configuration of the PMOS gate bias pull-up transistor PW1 and the PMOS output transistor P0 require that the potential of the signal line nwell should be approximately equal to the supply potential $V_{dd}$. The source node of the output bias transistor P0 is tied to supply potential $V_{dd}$, biasing the p-junction of a first pn junction diode formed between the source terminal and the bulk terminal of the transistor P0. As a result, the first pn junction diode is forward biased unless the potential on signal line nwell is approximately equal to or greater than supply potential $V_{dd}$. This forward bias condition results in the potential on signal line nwell increasing until it is approximately equal to the first power supply potential $V_{dd}$.

An analogous condition exists for PMOS gate bias pull-up transistor PW1. The source terminal of the PMOS gate bias pull-up transistor PW1 is coupled to the pad 410 which is in turn driven to logic high, thereby biasing the p-junction of a second pn junction diode formed between the source terminal and the bulk terminal of the transistor PW1. The second pn junction diode also contributes to increasing the potential on the signal line nwell to approximately equal the first power supply potential $V_{dd}$.

A third pn junction diode, formed between the source terminal and the bulk terminal of the PMOS Nwell bias transistor PW0 electrically couples the pad 410 to the signal line nwell when the potential of the pad 410 exceeds the potential of the signal line nwell.

Additionally, the PMOS PG bias transistor PW2 contributes to setting the potential of the signal line nwell in an analogous manner. Both the source terminal and the drain terminal of the transistor PMOS PG bias transistor PW2 are approximately at the first power supply potential $V_{dd}$, thereby biasing the p-junctions of a fourth pn junction diode formed between the source terminal and the bulk terminal and a fifth pn junction diode formed between the drain terminal and the bulk terminal of the transistor PMOS PG bias transistor PW2. The fourth pn junction diode and the fifth pn junction diode will also contribute to increasing the potential on the signal line nwell to approximately equal the first power supply potential $V_{dd}$. A source terminal to bulk terminal sixth pn junction diode and a drain terminal to bulk terminal seventh pn junction diode in PMOS passgate transistor Ppg will similarly contribute to biasing the signal line nwell in this operating condition.

The logic high input signal applied to the pad 410 is coupled to the input buffer 420. The output of the input buffer 420 is a logic high applied to the signal line $c_{in}$, with a potential approximately equal to the first power supply potential $V_{dd}$.

iii. Input Condition at a Potential Exceeding the First Power Supply Potential $V_{dd}$ We lastly consider a case where the input condition of the pad 410 is a logic high at a potential exceeding the first power supply potential $V_{dd}$. Since the gate terminal of the PMOS Nwell bias transistor PW0 is fixed at approximately the first power supply potential $V_{dd}$, as the source terminal of the PMOS Nwell bias transistor PW0 increases in potential above the first power supply potential $V_{dd}$, the PMOS Nwell bias transistor PW0 is biased into conduction. When the source terminal potential of the PMOS Nwell bias transistor PW0 exceeds $V_{dd}+|V_{tp}|$, where $|V_{tp}|$ is the magnitude of the threshold voltage for the PMOS Nwell bias transistor PW0, the PMOS Nwell bias transistor PW0 will become substantially conducting. As a result, the potential on the drain terminal and the bulk terminal of the PMOS Nwell bias transistor PW0 and the drain terminal and the bulk terminal of the PMOS Nwell bias transistor PW3 will approximately track the potential applied to the pad 410.

We now consider the bias condition for the signal line nwell. The drain node of the PMOS output transistor P0 is coupled to the pad 410 having a potential exceeding the circuit supply potential $V_{dd}$, in turn biasing the p-junction of the first pn junction diode formed between the source terminal and the bulk terminal of the PMOS output transistor P0. As a result, the first pn junction diode is forward biased unless the potential on signal line nwell is approximately equal or greater than the potential applied to pad 410. This forward bias condition results in the potential on the signal line nwell increasing until it is approximately equal to the potential on the pad 410. An analogous condition exists for the PMOS gate bias pull-up transistor PW1. The source terminal of the PMOS gate bias pull-up transistor PW1 is also coupled to the pad 410, thereby biasing the p-junction of the second pn junction diode formed between the source terminal and the bulk terminal of the transistor PW1. The second pn junction diode will also contribute to increasing the potential on the signal line nwell to approximately equal the potential applied to the pad 410. The drain terminal of the PMOS PG bias transistor PW2, being coupled to the input pad 410, will bias the p-junction of the fifth pn junction diode formed between the drain terminal and the bulk terminal of the PMOS PG bias transistor PW2, further contributing to increasing the potential on the signal line nwell to approximately equal the potential applied to the pad 410.

We now consider the PMOS PG bias transistor PW2. The gate terminal of the PMOS PG bias transistor PW2 is coupled to the first power supply potential $V_{dd}$. The potential on the source terminal of the PMOS PG bias transistor PW2, by virtue of the source terminal being coupled to the pad 410, exceeds the gate terminal potential of the PMOS PG bias transistor PW2. Hence, the PMOS PG bias transistor PW2 is biased into conduction, thereby raising the potential on the signal line PG to approximately track the potential on pad 410, and coupling the pad 410 potential to the gate terminal of the PMOS output transistor P0. Thus, both the gate terminal and the bulk terminal of PMOS output transistor P0 will approximately track the potential on the pad 410, keeping the PMOS output transistor P0 biased in an off condition. This effectively prevents unwanted conduction from the pad 410 to the first power supply potential $V_{dd}$ when the input applied to the pad 410 exceeds the first power supply potential $V_{dd}$, thereby fulfilling a goal of the present invention.

The potentials on the gate terminal and the bulk terminal of the PMOS gate bias pull-down transistor Pnew will track increases in the potential applied to the pad 410 since the gate terminal is coupled to the pad 410 and the bulk terminal is coupled to the signal line nwell. Consequently, the PMOS gate bias pull-down transistor Pnew is biased in an off condition. Since the gate terminal of the PMOS gate bias pull-up transistor PW1 is coupled to the first power supply potential $V_{dd}$, the PMOS gate bias pull-up transistor PW1 is biased into conduction as the potential on the source terminal of the PMOS gate bias pull-up transistor PW1 exceeds $V_{dd}$. This results in the potential on signal line Gpb increasing so as to approximately track the potential on the pad 410.

The PMOS Nwell drive transistor PW3 is biased off since its gate terminal potential and its bulk terminal potential each approximately track the potential applied to the pad 410. Since the PMOS Nwell drive transistor PW3 is biased off, an unwanted current path between the signal line nwell and the circuit power supply potential $V_{dd}$ is precluded.

The PMOS passgate transistor Ppg is also biased in an off condition, since its bulk terminal tracks the potential on the pad 410 by means of the bulk terminal's coupling to the signal line nwell, and since the gate terminal of the PMOS passgate transistor Ppg is coupled to the signal line Gpb which also tracks the potential on the pad 410. Since PMOS passgate transistor Ppg is biased off, it prevents an unwanted current path between the signal line PG and the signal line p_dc in this operating condition. The NMOS passgate transistor Npg is also biased into an off condition since the relative potential between the gate terminal and the source terminal of the NMOS passgate transistor Npg is zero.

The logic high input signal applied to the pad 410 is coupled to the input buffer 420. The output of the input buffer 420 is a logic high applied to the signal line $c_{in}$, with a potential approximately equal to the first supply potential $V_{dd}$. In the exemplary embodiment of the present invention, the input buffer 420 input comprises a CMOS inverter stage. Hence the input signal is applied to the gate terminals of MOSFET devices having no direct current path to the power supply terminals. Therefore, the presence of a potential on the pad 410 exceeding the first power supply potential $V_{dd}$ will not produce any unwanted conduction, as long as the applied potential does not exceed the maximum breakdown limits associated with the particular process technology employed to fabricate the I/O buffer circuit 400.

With reference to FIG. 6, a tri-state capable inverter 600 is an exemplary embodiment of tri-state capable PG inverter inv1P and of tri-state capable NG inverter inv1N shown in FIG. 5. The tri-state capable inverter 600 is coupled to a first power supply potential $V_{dd}$, a second power supply potential gnd, and is comprised of an input terminal 610, an output terminal 620, a first control terminal 630, a second control terminal 640, a PMOS inverter transistor 650, a PMOS control transistor 660, an NMOS control transistor 670, and an NMOS inverter transistor 680. The source terminal of the PMOS inverter transistor 650 is coupled to the first power supply potential $V_{dd}$. The drain of the PMOS inverter transistor 650 is coupled to the source of the PMOS control transistor 660. The bulk terminal of the PMOS control transistor 660 and the bulk terminal of the PMOS inverter transistor 650 are coupled to each other and to the first power supply potential $V_{dd}$. The gate terminal of the PMOS control transistor 660 is coupled to the control terminal 630, and the drain of the PMOS control transistor 660 is coupled to the drain of the NMOS control transistor 670 and to the output terminal 620. The source terminal of the NMOS control transistor 670 is coupled to the drain terminal of the NMOS inverter transistor 680. The source terminal of the NMOS inverter transistor 680 is coupled to the bulk terminal of the NMOS transistor 680 and to the second power supply terminal with potential gnd. The bulk terminal of the NMOS control transistor 670 is coupled to the second power supply potential gnd. The gate terminal of the PMOS inverter transistor 650 is coupled to the gate terminal of the NMOS inverter transistor 680 and to the input terminal 610.

In active operation, the signal OEN applied to the first control terminal is asserted low, biasing the PMOS control transistor 630 into conduction. Concurrently, the signal $\overline{OEN}$ is asserted high, biasing the NMOS control transistor 670 into conduction. The PMOS inverter transistor 650 and the NMOS inverter transistor 680 will now be able to operate as a conventional CMOS inverter, as known to those skilled in the art. The input signal "i", applied to the input terminal 610, is logically inverted and coupled to the output terminal 620 as a signal out.

When signal OEN is asserted high to induce the tri-state condition, the PMOS control transistor 660 is biased into an off condition. Concurrently, signal $\overline{OEN}$ is asserted low, causing the NMOS control transistor 670 to be biased into an off condition. Consequently, the output terminal 620 is placed in a floating condition, and any externally applied signal on the output terminal 620 will not have a current path through the tri-state capable inverter 600 to either power supply. Furthermore, the tri-state capable inverter 600 is unresponsive to any input signals applied to the input terminal 610.

With reference to FIG. 7, electrical relationships are given for selected circuit nodes as a function of an input signal applied to an exemplary voltage tolerant circuit of the present invention. $V_{dd}$ represents the first power supply potential $V_{dd}$, and $V_{max}$ represents a maximum potential above the first power supply potential $V_{dd}$ which may be applied to devices without exceeding device limits set by breakdown or other process/performance attributes. A pad potential line 710 illustrates a continually increasing potential applied to the pad 410 (FIG. 5). A $V_{dd}$ potential line 720 illustrates the first power supply potential $V_{dd}$, which remains constant at value $V_{dd}$. An Nwell potential line 730 illustrates the behavior of the signal line nwell (FIG. 5) in response to the increasing pad potential. The Nwell potential line is seen to remain fixed at approximately $V_{dd}$ until the pad potential exceeds $V_{dd}$. At this point, the Nwell potential line approximately tracks the pad potential. A $V_{dd}$ current line 740, read on the right-hand vertical scale, illustrates the nominal current supplied by the first power supply potential $V_{dd}$ of FIG. 5 in response to the changing pad input condition. It is observed that there is no deviation from a nominal zero current; that is, no shoot through current results at any applied pad potential.

With reference to FIG. 8, an integrated circuit 800 using the present invention includes an integrated circuit core 810 which is coupled to the I/O buffer circuit 400 by a control line 820 conveying signal OEN, an input mode data line 830 conveying signal $c_{in}$, and an output mode data line 840 which conveying signal "i." The I/O buffer circuit 400 is coupled the pad 410. The integrated circuit core 810 can be any known circuit utilizing digital data. The integrated circuit 800 is fabricated by known techniques.

In the foregoing specification, the invention has been described with reference to specific embodiments thereof. It will, however, be evident that various modifications and changes can be made thereto without departing from the broader spirit and scope of the invention as set forth in the appended claims. For example, those skilled in the art will recognize that it is possible to fabricate multiple PMOS devices in a single nwell such that all the PMOS devices share a common bulk terminal potential. Conversely, it is possible to fabricate multiple PMOS devices in separate nwells and provide a common bulk terminal potential by means of electrical interconnects between the separate nwells. Additionally, those skilled in the art will appreciate the fact that multiple MOSFET devices may be employed to provide pull-up or pull-down means, and that the multiple MOSFET devices employed in this manner are frequently represented with a single MOSFET symbol in a circuit schematic. The specification and drawings are, accordingly, to be regarded in an illustrative rather than a restrictive sense.

What is claimed is:

1. An apparatus having an input mode and coupled between first and second supply potentials, the apparatus comprising:

an input/output node to receive an input signal; a PMOS pull-up transistor having gate, source, drain and body terminals, and fabricated in an nwell, the source terminal coupled to the first supply potential and the drain terminal coupled to the input/output node;

an NMOS pull-down transistor having source and drain terminals, the source terminal coupled to the second supply potential and the drain terminal coupled to the input/output node;

a gate bias control transistor having gate, source, and drain terminals, the source terminal coupled to the input node, the drain coupled to the gate of the PMOS pull-up transistor, and the gate terminal coupled to the first supply potential and configured to couple the gate of the PMOS pull-up transistor to the input/output node an response to the input signal having a potential greater than approximately the first supply potential;

a passgate having an NMOS passgate transistor and a PMOS passgate transistor, the NMOS passgate transistor and the PMOS passgate transistor each having source and drain terminals, the source terminals of each passgate transistor coupled to each other and to a circuit node with a potential configured to be approximately equal to the first supply potential during the input mode, and the drain terminals coupled to each other and to the gate of the PMOS pull-up transistor and configured to couple the gate of the PMOS pull-up transistor to the first supply potential in response to the input signal having a potential approximately equal to or less than the first supply potential; and a well bias control circuit having an nwell terminal coupled to the nwell of the PMOS pull-up transistor and to a well drive transistor coupled between the first supply potential and the nwell terminal, the well drive transistor configured to couple the nwell terminal to the first supply potential in response to the input signal having a potential approximately equal to or less than the first supply potential, the well bias control circuit further comprising a gate pull-up transistor coupled between the input/output node and the gate terminal of the PMOS passgate transistor.

2. The apparatus of claim 1, wherein the well bias control circuit further comprises a PMOS gate pull-down transistor coupled between the second supply potential and the gate terminal of the PMOS passgate transistor, the gate pull-down transistor further coupled between the second supply potential and the gate terminal of the well drive transistor.

3. The apparatus of claim 2, wherein the PMOS gate pull-down transistor has the lowest absolute threshold voltage, $|V_{tp}|$, of any of the PMOS transistors comprising the apparatus.

4. The apparatus of claim 2, wherein the PMOS gate pull-down transistor has a gate terminal coupled to the input/output node.

5. The apparatus of claim 1, wherein the well bias control circuit further comprises at least one PMOS transistor having a source terminal and a bulk terminal, the source terminal coupled to the input/output node, the bulk terminal coupled to the nwell terminal, and the source terminal and the bulk terminal further comprising a pn source to bulk diode such that the diode is configured to be biased into forward conduction when a potential of the source terminal is more positive than a potential of the bulk terminal.

6. The apparatus of claim 1, wherein:

the well drive transistor is a PMOS device having a bulk terminal; and the well bias control circuit further comprises a PMOS discharge transistor having source, drain, gate, and bulk terminals, the source terminal coupled to the input/output node, the gate terminal coupled to the first power supply potential, and the drain terminal and bulk terminal coupled to each other and to the bulk terminal on the nwell drive transistor.

7. An input/output (I/O) buffer having an input mode and coupled between first and second supply potentials, the input/output buffer comprising:
 an input/output node;
 a PMOS pull-up transistor having gate, source, drain and body terminals, and fabricated in an nwell, the source terminal coupled to the first supply potential and the drain terminal coupled to the input/output node;
 an NMOS pull-down transistor having source and drain terminals, the source terminal coupled to the second supply potential and the drain terminal coupled to the input/output node;
 a gate bias control transistor having gate, source, and drain terminals, the source terminal coupled to the input node, the drain coupled to the gate of the PMOS pull-up transistor, and the gate terminal coupled to the first supply potential and configured to couple the gate of the PMOS pull-up transistor to the input/output node in response to the input signal having a potential greater than approximately the first supply potential;
 a passgate having an NMOS passgate transistor and a PMOS passgate transistor, the NMOS passgate transistor and the PMOS passgate transistor each having source and drain terminals, the source terminals of each passgate transistor coupled to each other and to a circuit node with a potential configured to be approximately equal to the first supply potential during the input mode, and the drain terminals coupled to each other and to the gate of the PMOS pull-up transistor and configured to couple the gate of the PMOS pull-up transistor to the first supply potential in response to the input signal having a potential approximately equal to or less than the first supply potential; and
 a well bias control circuit having an nwell terminal coupled to the nwell of the PMOS pull-up transistor and to a well drive transistor coupled between the first supply potential and the nwell terminal, the well drive transistor configured to couple the nwell terminal to the first supply potential in response to the input signal having a potential approximately equal to or less than the first supply potential, the well bias control circuit further comprising a gate pull-up transistor coupled between the input/output node and the gate terminal of the PMOS passgate transistor, the gate pull-up transistor further coupled between the input/output node and the gate terminal of the well drive transistor and configured to couple the gate terminals to the input/output node during the input mode in response to the input signal having a potential greater than approximately the first supply potential.

8. The input/output buffer of claim 7, wherein the well bias control circuit further comprises a PMOS gate pull-down transistor coupled between the second supply potential and the gate terminal of the PMOS passgate transistor, the gate pull-down transistor further coupled between the second supply potential and the gate terminal of the well drive transistor.

9. The input/output buffer of claim 8, wherein the PMOS gate pull-down transistor has the lowest absolute threshold voltage, $|V_{tp}|$, of any of the PMOS transistors comprising the input/output buffer.

10. The input/output buffer of claim 8, wherein the PMOS gate pull-down transistor has a gate terminal coupled to the input/output node.

11. The input/output buffer of claim 7, wherein the well bias control circuit further comprises at least one PMOS transistor having a source terminal and a bulk terminal, the source terminal coupled to the input/output node, the bulk terminal coupled to the nwell terminal, and the source terminal and the bulk terminal further comprising a pn source to bulk diode such that the diode is configured to be biased into forward conduction when a potential of the source terminal is more positive than a potential of the bulk terminal.

12. The input/output buffer of claim 7, wherein:
 the well, drive transistor is a PMOS device having a bulk terminal; and
 the well bias control circuit further comprises a PMOS discharge transistor having source, drain, gate, and bulk terminals, the source terminal coupled to the input/output node, the gate terminal coupled to the first power supply potential, and the drain terminal and bulk terminal coupled to each other and to the bulk terminal on the nwell drive transistor.

13. An integrated circuit including an input/output (I/O) buffer having an input mode and coupled between first and second supply potentials, the integrated circuit comprising;
 an integrated circuit core coupled to the input/output buffer;
 a pad coupled to the input/output buffer; the input/output buffer having:
 an input/output node;
 a PMOS pull-up transistor having gate, source, drain and body terminals, and fabricated in an nwell, the source terminal coupled to the first supply potential and the drain terminal coupled to the input/output node;
 an NMOS pull-down transistor having source and drain terminals, the source terminal coupled to the second supply potential and the drain terminal coupled to the input/output node;
 a gate bias control transistor having gate, source, and drain terminals, the source terminal coupled to the input node, the drain coupled to the gate of the PMOS pull-up transistor, and the gate terminal coupled to the first supply potential and configured to couple the gate of the PMOS pull-up transistor to the input/output node in response to the input signal having a potential greater than approximately the first supply potential;
 a passgate having an NMOS passgate transistor and a PMOS passgate transistor, the NMOS passgate transistor and the PMOS passgate transistor each having source and drain terminals, the source terminals of each passgate transistor coupled to each other and to a circuit node with a potential configured to be approximately equal to the first supply potential during the input mode, and the drain terminals coupled to each other and to the gate of the PMOS pull-up transistor and configured to couple the gate of the PMOS pull-up transistor to the first supply potential in response to the input signal having a potential approximately equal to or less than the first supply potential; and
 a well bias control circuit having an nwell terminal coupled to the nwell of the PMOS pull-up transistor and to a well drive transistor coupled between the first supply potential and the nwell terminal, the well drive transistor configured to couple the nwell terminal to the first supply potential in response to the input signal having a potential approximately equal to or less than the first supply potential, the well bias control circuit further comprising a PMOS gate pull-down transistor coupled between the second supply potential and the gate terminal of the PMOS passgate transistor, the gate pull-down transistor further coupled between the second supply potential and the gate terminal of the well drive transistor.

14. The integrated circuit of claim 13, wherein the well bias control circuit further comprises a gate pull-up transistor coupled between the input/output node and the gate terminal of the PMOS passgate transistor, the gate pull-up transistor further coupled between the input/output node and the gate terminal of the well drive transistor and configured to couple the gate terminals to the input/output node during the input mode in response to the input signal having a potential greater than approximately the first supply potential.

15. The integrated circuit of claim 13, wherein the PMOS gate pull-down transistor has the lowest absolute threshold voltage, $|V_{tp}|$, of any of the PMOS transistors comprising the input/output buffer.

16. The integrated circuit of claim 13, wherein the PMOS gate pull-down transistor has a gate terminal coupled to the input/output node.

17. The integrated circuit of claim 13, wherein the well bias control circuit further comprises at least one PMOS transistor having a source terminal and a bulk terminal, the source terminal coupled to the input/output node, the bulk terminal coupled to the nwell terminal, and the source terminal and the bulk terminal further comprising a pn source to bulk diode such that the diode is configured to be biased into forward conduction when a potential of the source terminal is more positive than a potential of the bulk terminal.

18. The integrated circuit of claim 13, wherein:

the well drive transistor is a PMOS device having a bulk terminal; and the well bias control circuit further comprises a PMOS discharge transistor having source, drain, gate, and bulk terminals, the source terminal coupled to the input/output node, the gate terminal coupled to the first power supply potential, and the drain terminal and bulk terminal coupled to each other and to the bulk terminal on the nwell drive transistor.

* * * * *